United States Patent [19]

Hemmerdinger et al.

[11] Patent Number: 4,704,258

[45] Date of Patent: Nov. 3, 1987

[54] METHOD AND APPARATUS FOR GROWTH OF SINGLE CRYSTAL MATERIAL IN SPACE

[75] Inventors: Louis Hemmerdinger, Old Bethpage; Herbert Schneider, Plainview, both of N.Y.

[73] Assignee: Grumman Aerospace Corporation, Bethpage, N.Y.

[21] Appl. No.: 846,682

[22] Filed: Apr. 1, 1986

[51] Int. Cl.$^4$ .................................................. B01B 9/00
[52] U.S. Cl. ..................................... 422/254; 156/606; 156/607; 156/608; 156/611; 156/612; 156/DIG. 62; 156/DIG. 83; 156/DIG. 98
[58] Field of Search ........................ 422/250, 253, 254; 156/606, 607, 608, 611, 612, DIG. 62, DIG. 83, DIG. 98; 220/85 H

[56] References Cited

U.S. PATENT DOCUMENTS

| | | | |
|---|---|---|---|
| 3,534,926 | 10/1970 | Wuencher | 156/DIG. 62 |
| 3,568,757 | 3/1971 | Piearcey | 164/353 |
| 3,842,895 | 10/1974 | Mehrabian et al. | 164/466 |
| 4,285,760 | 8/1981 | Myer | 156/617 H |
| 4,298,191 | 11/1981 | Atkinson et al. | 266/165 |
| 4,307,769 | 12/1981 | Hauser et al. | 164/154 |

FOREIGN PATENT DOCUMENTS

| | | | |
|---|---|---|---|
| 2721089 | 5/1977 | Fed. Rep. of Germany | 156/611 |
| 9111995 | 12/1982 | Japan | 422/254 |
| 272269 | 7/1967 | U.S.S.R. | 422/253 |

OTHER PUBLICATIONS

T. Burkhalter, "The Industrial Research Laboratory in Space," Advances in Astronautical Sciences, vol. 23, 1968, pp. 211-219.
R. Schwinghamer, "Magnetic Forming in Space," Astronautics, Sep. 1962, pp. 63-67.
V. Kirkland, "Design of a Commercial Space Station," Advances in Astronautical Sciences, vol. 23, 1968, pp. 220-221.

Primary Examiner—Asok Pal
Attorney, Agent, or Firm—Pollock, VandeSande & Priddy

[57] ABSTRACT

An ampoule assembly for the growth of single crystal materials is particularly adapted for a micro-gravity environment and includes a plurality of centering rods for spacing a crystalline material from the inner surface of an ampoule. The centering rods are spaced relative to one another to form a dopant vapor passageway to provide uniform stoichiometry of the crystal upon melting and resolidification. Minimum contact between ampoule and the crystalline material ensures greater purity of the crystalline material when the material is transformed into a single crystal.

4 Claims, 11 Drawing Figures

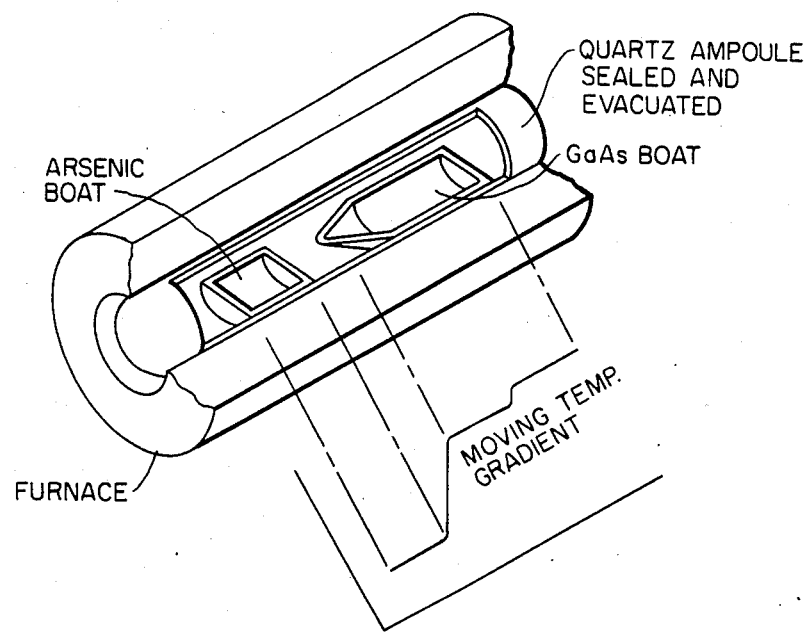
FIG. IA
(PRIOR ART)
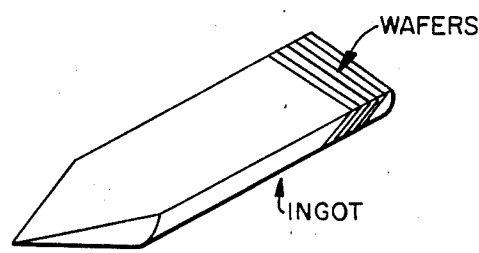
FIG. IB
(PRIOR ART)

METHOD AND APPARATUS FOR GROWTH OF SINGLE CRYSTAL MATERIAL IN SPACE

FIELD OF THE INVENTION

The present invention relates to the growth of single crystal materials in space, and more particularly to an ampoule and corresponding method for containing material during crystal growth in the micro-gravity environment of space.

BRIEF DESCRIPTION OF THE PRIOR ART

FIGS. 1A–2B illustrate two prior art apparatus for the crystal growth of gallium arsenide (GaAs). The apparatus illustrated in FIG. 1A is employed in a conventional horizontal Bridgman method. In order to achieve crystal growth with this method, it is necessary to locate an arsenic boat adjacent to a separate GaAs boat within the interior of a quartz ampoule which is sealed and evacuated. The boat would normally receive a supply of polycrystalline GaAs material; and a small seed of single crystal GaAs is deposited at the apex of the boat. A surrounding furnace heats the arsenic in the arsenic boat and also subjects the crystalline material in the GaAs boat to a melt temperature in accordance with a moving gradient. During this time, arsenic gas diffuses from the arsenic boat into liquid GaAs to maintain a 50—50 Ga and As component content in the GaAs boat. After all of the crystalline material is melted, cooling of the GaAs boat occurs and the original polycrystalline material is converted to a single crystal ingot such as shown in FIG. 1B. Individual wafers can then be cut from the ingot. Unfortunately, the cross sections of such wafers are D-shaped which are inappropriate for general use in semiconductor chip fabrication methods. To make them compatible, circular sections are cut out of the D-shaped wafers leading to significant waste of material. In addition, there is lack of true uniformity through the ingot due to gravity-induced convection. Further problems in the prior art method include contamination from the container and defects due to the container overly constraining a melt that expands upon solidification.

FIG. 2A illustrates the apparatus incident to a second prior art method known as the liquid-encapsulated Czochralski method. As indicated in FIG. 2A, a crucible is encircled by a furnace; and within the crucible a supply of GaAs material is deposited which will subsequently become molten when the furnace heats the material. $B_2O_3$ liquid forms an encapsulant on top of the GaAs to prevent sublimation of the As. A support chuck retains a seed of single crystal GaAs which is dipped into the molten GaAs and the chuck is slowly withdrawn upwardly while being turned. This results in a cooling of the GaAs to form an ingot generally shaped as a crayon. Round wafers may be cut from the ingot which are of the shape preferred during fabrication methods for semiconductor chips. Although this latter-mentioned advantage of the Czochralski method makes it superior to the previously discussed Bridgman method, the surface of a resulting ingot as shown in FIG. 2B is in reality continually changing in diameter. Accordingly, the ingot is cut or ground to the desired diameter prior to cutting into wafers. The Czochralski method results in non-uniform mixture components due to changes in arsenic content and gravity-induced convection. Further, significant stresses are built up in the ingot due to cooling and gravity forces on the material as well as contamination from the container which can affect the quality of the grown crystal.

BRIEF DESCRIPTION OF THE PRESENT INVENTION

The availability of a micro-gravity environment in space provides the opportunity to minimize or eliminate natural convection in material undergoing crystal growth and to minimize interaction between the material and an ampoule. It is to be stressed that, although the following discussion of the invention is directed to the material GaAs, this is not intended to be a limitation. Rather, the present invention is generally applicable to crystal growth in a micro-gravity environment. The present invention is directed to a method and apparatus that are flown in space under micro-gravity conditions and will permit a material to be melted directionally or by zones, resolidified, or grown as a crystal, with uniform stoichiometry, minimum stresses and minimum contamination or configuration defects from a container.

The present invention encompasses embodiments which can provide desired stoichiometry by controlling vapor pressure over the melt from a dopand zone maintained at a specific temperature. This can be accomplished by utilizing rod-shaped spacers between the polycrystalline material rod and a surrounding ampoule vessel.

BRIEF DESCRIPTION OF THE FIGURES

The above-mentioned objects and advantages of the present invention will be more clearly understood when considered in conjunction with the accompanying drawings, in which:

FIG. 1A is a perspective cutaway diagram of an apparatus as used in the prior art horizontal Bridgman method;

FIG. 1B is a perspective view of an ingot as formed by the Bridgman method;

DETAILED DESCRIPTION OF THE INVENTION

Figure 2A:
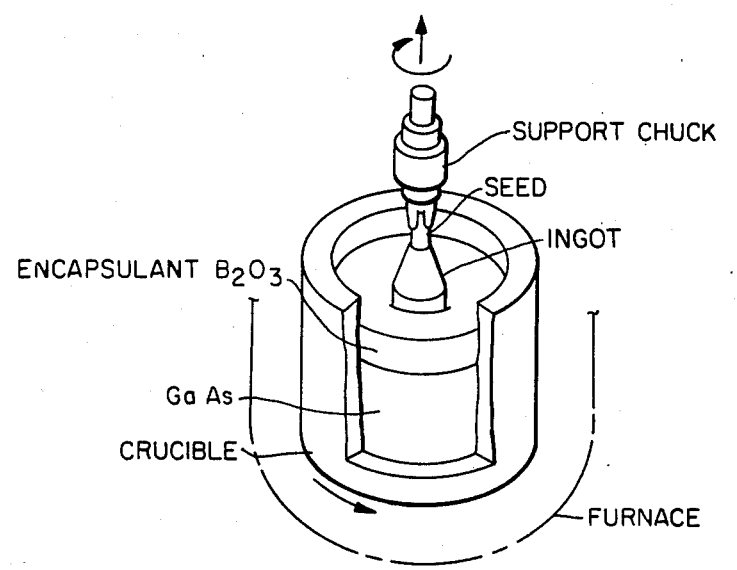
FIG. 2A is a perspective cutaway view of apparatus as employed in the liquid-encapsulated Czochralski method.
Figure 2B:
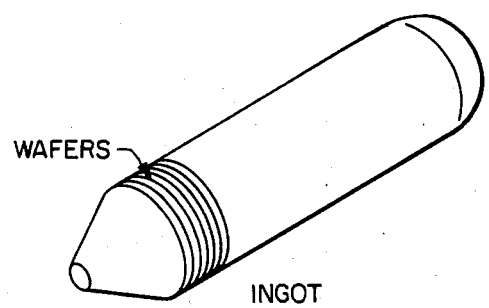
FIG. 2B is a perspective illustration of an ingot as formed by the Czochralski method.
Figure 3B:
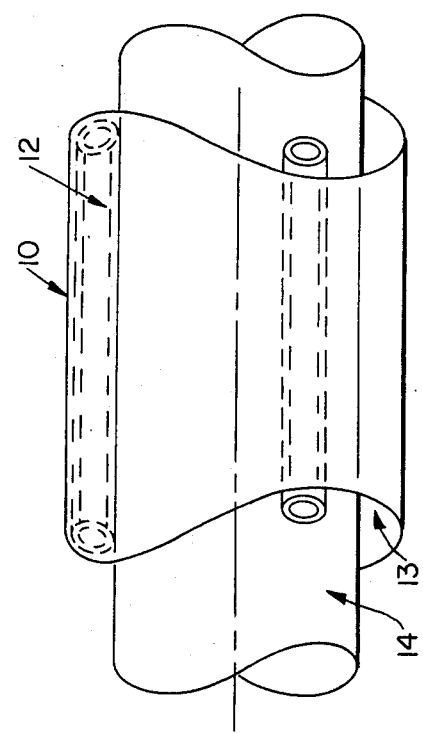
FIG. 3B is a side view of an ampoule made in accordance with the present invention.
Figure 3A:
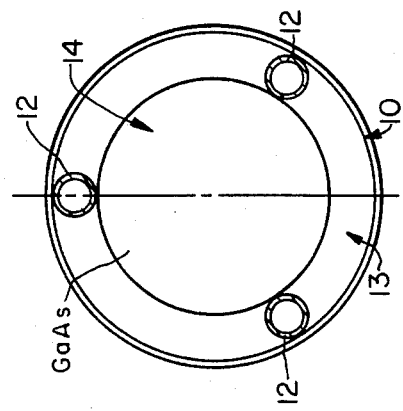
FIG. 3A is an end view of an ampoule made in accordance with the present invention.

FIGS. 3A and 3B illustrate the basic concept of an ampoule as used in connection with the present invention. A cylindrical ampoule 10, which is preferably made of quartz, is illustrated as surrounding a cylindrical rod 14, which may be composed of a polycrystalline mixture of GaAs. Three or more centering rods, struts or weave 12 are positioned between the interior surface of ampoule 10 and the radially outward surface of rod 14. The present invention will discuss the utilization of three centering rods. However, this is considered a minimum and more centering rods, spaced from one another even to the extent of a weave, may be employed. As will be seen from FIG. 3A, annular space 13 is provided between the ampoule 10 and the GaAs due to the spacing effect of the centering rods so that a vapor passage becomes created through the annular space 13. As will be explained in greater detail hereinafter, this vapor passage is employed for the diffusion of arsenic gas (dopant) into the GaAs ingot 14 when the polycrystalline GaAs ingot 14 is in a melt condition, as was previously explained in connection with the Bridgman method (FIG. 1A). The centering rods 12 provide support for the ingot 14 when the entire configuration is launched into space and likewise provides support for a transformed ingot (polycrystalline - single crystal) upon landing back on Earth. The annular space 13 which provides a vapor passage can be used to maintain proper dopant vapor pressure to assure proper stoichiometry of a processed material. These passages also provide room for the crystalline material to expand if it is of a type that increases in volume upon solidification.

When the ingot 14 is melted in a micro-gravity environment, surface tension will urge the melted crystalline material to assume a spherical shape. However, the rods 12 will constrain the melt and keep it in a nearly cylindrical shape. The amount of surface contact between the melt and the ampoule 10 is limited to one line contact per rod thereby minimizing the surface area available for contamination by diffusion from the ampoule. Thus, the present invention provides dimensional control of a finished single crystal ingot and avoids the other disadvantages associated with stoichiometry, stresses and contamination discussed in connection with the prior art.

It is also possible to process the material by the zone refinement technique. The solid ingot 14 is contained within the centering rods and only a small section is melted. The melted portion may contract and shrink away from the rods further minimizing contact. The melted portion is supported front and back by adhesion to the remaining solid portions of the ingot. This melted zone may then be allowed to progress axially through the material until a finished ingot is produced.

Figure 4A:
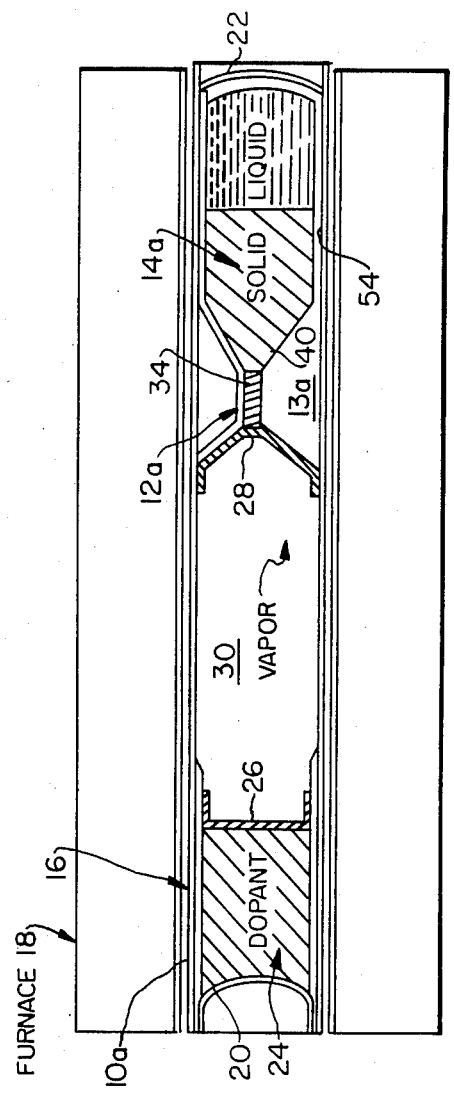
FIG. 4A is a cross-sectional view of a second ampoule configuration constituting the present invention.

FIG. 4A illustrates an ampoule assembly 16 axially disposed along the interior of an available furnace 18 which is capable of establishing different temperature zones along the furnace length. A quartz cylindrical ampoule 10a forms an outer housing for the ampoule assembly 16 and has its ends closed by closures 20 and 22 after the internal components to be discussed have been inserted therein. As illustrated in FIG. 4A, a solid dopant 24 is contained within ampoule 10a and the right-illustrated end of the solid dopant is contained by a cup-shaped mesh retainer 26. A central cavity 30 exists in the interior of the ampoule 10a and to the right end of this cavity is a conically shaped mesh retainer 28. The purpose of mesh retainers 26 and 28 is to permit the diffusion of dopant gas across the central chamber 30 to be mixed with the solid crystalline ingot 14a located to the right of mesh retainer 28. The diffusion of dopant into the crystalline material is therefore similar to the previously discussed Bridgman method of FIG. 1A. As in that method, a seed 34 is positioned adjacent a tapered end 40 of crystalline ingot 14a.

Figure 6:
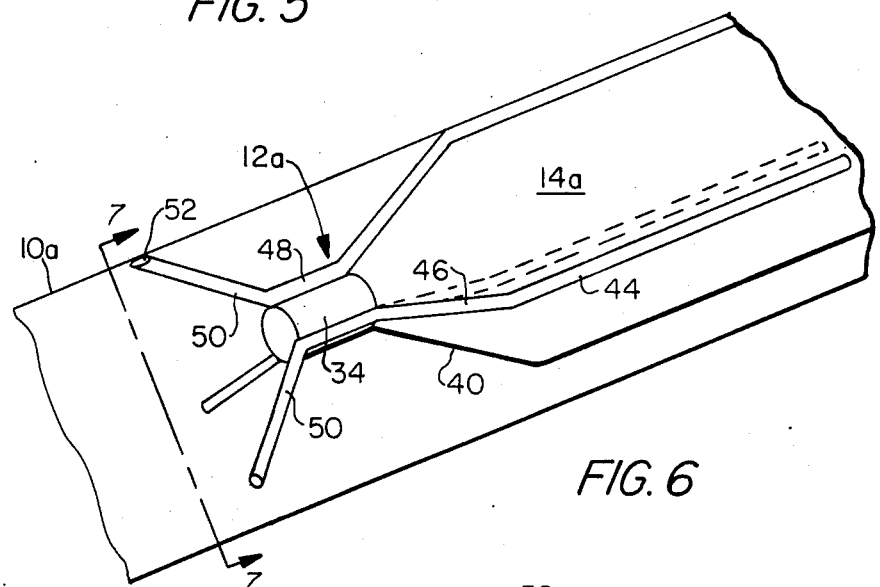
FIG. 6 is a perspective view of centering rods as employed in the invention.
Figure 7:
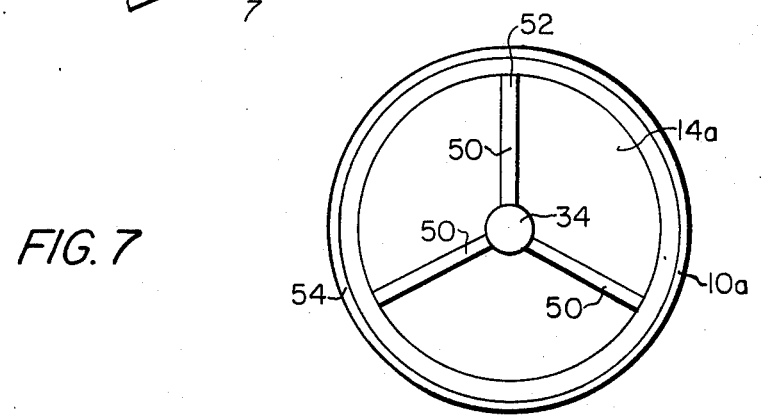
FIG. 7 is a cross-sectional view taken along a plane passing through section line 7—7 of FIG. 6.

However, instead of using the boats of the Bridgman method, the system indicated in FIG. 4A utilizes centering rods 12a, which are linearly deformed to follow the surface of seed 34 and tapered end 40 of crystalline rod 14a. Only one centering rod 12a is shown in FIG. 4A in order to add clarity to the figure. However, in reality, there are a minimum of three such centering rods, as shown in FIGS. 6 and 7. Referring to these latter-mentioned figures, each centering rod 12a is seen to include an elongated section which is positioned in parallel spaced relationship to the axis of ampoule 10a. The elongated section 44 of rod 12a tapers down along section 46 to contact mating tapered end 40 of crystalline ingot 14a. Each centering rod then continues along a central section 48 which supports seed 34 and a final left end tapered section 50 of each centering rod contacts a confronting surface of mesh retainer 28. The outward ends 52 of each centering rod section 50 contact the inner surface 54 of ampoule 10a.

As indicated in FIG. 4A, the central cavity 30 permits vapor from solid dopant 24 to diffuse across both mesh retainers 26 and 28, then space 13a, filling the cavity surrounding the material being processed (14a).

Figure 4B:
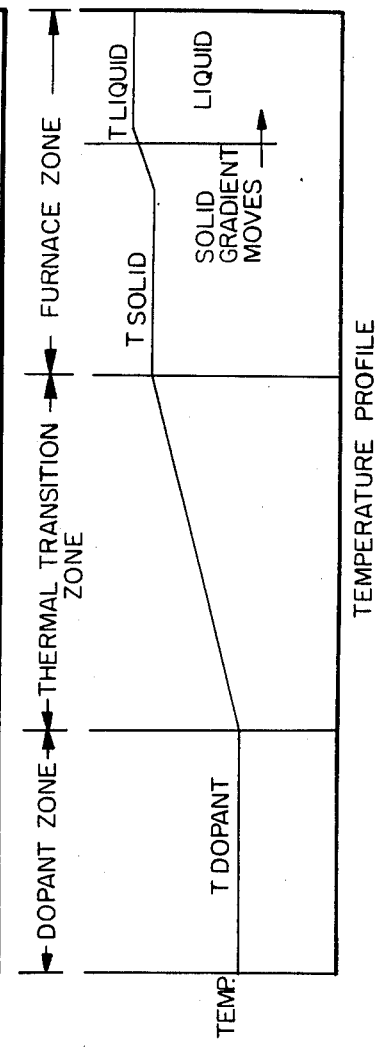
FIG. 4B is a temperature profile along the length of a furnace in which the second ampoule configuration of the present invention is located.

As indicated by the temperature profile of FIG. 4B, the solid dopant 24 is maintained at a constant temperature that yields a desired vapor pressure in cavity 30. As in the case of the simplified explanation given in connection with FIGS. 1A and 1B, an annular space is provided around the solid ingot 14a to permit the passage of vapor around the circumference of the ingot.

With the temperature profile illustrated in FIG. 4B, the right end of ingot 14a transforms to the liquid state and allows diffusion with the dopant gas. This gradient is moved until the entire crystalline ingot 14a becomes melted. Then, as in the previously discussed Bridgman method, the melted ingot is cooled in an axial direction and the seed 34 causes transformation of the melted ingot 14 into a single crystal ingot. However, as previously explained in connection with FIGS. 1A and 1B, when the ingot is melted in a micro-gravity environment, surface tension of the melted crystalline material would cause the material to assume a spherical shape without the centering rods. However, by including the centering rods 12a of the present invention, the melted ingot is constrained and kept in a nearly cylindrical shape under the influence of surface tension. The amount of surface contact between the melt of the ingot and the ampoule 10a is limited to one line contact per rod, thereby minimizing the surface area available for contamination by diffusion from the ampoule.

It should be noted that tapering of centering rods 12a to conform to the surface of ingot 14a is useful for supporting the seed 34 and ingot 14a during launch and landing in a space craft. This taper may be eliminated if the ingot is inserted and removed in a microgravity environment and also if there is no seed required or if the gradual buildup in ingot diameter during growth is not required.

Figure 5:
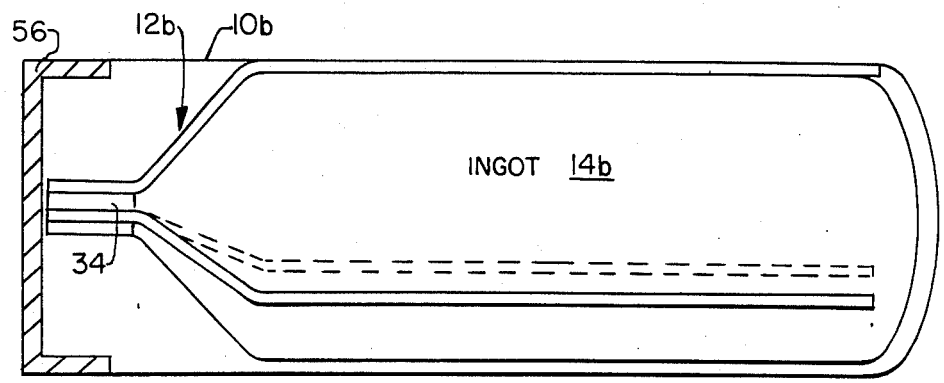
FIG. 5 is a third embodiment of the invention indicating another alternate ampoule configuration which is sealed.

FIG. 5 is an alternate embodiment of the invention. This eliminates the need for tapered ends 50 on rods 12b. Corresponding numerals are used for corresponding parts of FIGS. 5 and 4A. The figure indicates the use of centering rods 12b in a sealed ampoule zone wherein no dopant zone is included. Accordingly, the configuration shown in FIG. 5 is similar to the ampoule configuration in the furnace zone of FIG. 4A, with the exception that the mesh retainer 28 is replaced with a solid retainer 56 which also serves as a sealing closure for the ampoule 10b.

The embodiment of FIG. 5 requires a shortened ampoule 10b and this embodiment is useful where there is no requirement for diffusion of a dopant in the environment of a carefully controlled vapor pressure. Thus, the transformation of ingot 14b will occur from polycrystalline to single crystal with the dopant included in the solid mixture of the ingot. This ampoule configuration would not be appropriate for GaAs since the pressure-temperature relationship of the two materials are incompatible. However, the ampoule configuration would be quite useful for other materials.

It should be understood that the invention is not limited to the exact details of construction shown and described herein for obvious modifications will occur to persons skilled in the art.

We claim:

1. An ampoule assembly for containing a crystalline material ingot, the assembly comprising:
   a generally cylindrical hollow ampoule for containing the crystalline ingot;
   a plurality of spaced centering rods positioned in the ampoule which form line contacts with the ingot outer surface thereby decreasing contaminating contact between the ampoule and the ingot, and alleviating stresses on the ingot upon its solidification;
   wherein the centering rods include
   (a) a first section for receiving a single crystal seed;
   (b) a second section which is tapered and extends outwardly from the first section for permitting gradual seeding of the ingot when melted; and
   (c) a third section for contacting the main body of the ingot.

2. An ampoule assembly containing crystalline material and a solid dopant for transformation of the material to a single crystal ingot, the assembly comprising:
   a generally cylindrical hollow ampoule for containing the crystalline material and the solid dopant in axial spaced relation;
   a central chamber located within the ampoule;
   first and second mesh retaining means located within the ampoule and in spaced axial relation defining the boundary of the chamber, the retaining means respectively preventing movement of the solid dopant and crystalline material into the chamber while allowing the flow of dopant vapor thereacross, when the solid dopant sublimes;
   a plurality of centering rods axially positioned between the inner wall of the ampoule and the outer surface of the ingot for spacing the ingot from the wall and creating sufficient surface tension on the ingot when it is melted for retaining the ingot in a generally cylindrical shape in a micro-gravity environment;
   wherein passageways are formed between the ampoule inner wall and the crystalline material surface to permit dopant vapor to flow across the crystalline ingot surface;
   wherein the centering rods include
   (a) a first section for receiving a single crystal seed;
   (b) a second section which is tapered and extends outwardly from the first section for permitting gradual seeding of the ingot when melted; and
   (c) a third section for contacting the main body of the ingot.

3. The structure set forth in claim 2 wherein the centering rods include a fourth section which is tapered and extends outwardly from the first section in a direction opposite the second section, outer ends of the fourth section contacting the inner wall of the hollow ampoule for increasing the support of the centering rods.

4. The structure as set forth in claim 3 wherein the fourth section of the centering rods receives an abutting surface of the second mesh retaining means thereby securing the second mesh retaining means in place within the ampoule.

* * * * *

UNITED STATES PATENT AND TRADEMARK OFFICE
CERTIFICATE OF CORRECTION

PATENT NO. : 4,704,258

DATED : November 3, 1987

INVENTOR(S) : Louis Hemmerdinger, et al.

It is certified that error appears in the above-identified patent and that said Letters Patent is hereby corrected as shown below:

Column 2, line 24, change "dopand" to --dopant--.

Column 5, line 12, change "are" to --is--.

Signed and Sealed this

Tenth Day of May, 1988

Attest:

DONALD J. QUIGG

Attesting Officer

Commissioner of Patents and Trademarks